US012747389B2

(12) United States Patent
Li et al.

(10) Patent No.: US 12,747,389 B2
(45) Date of Patent: Sep. 29, 2026

(54) SELECTIVE ETCHING SOLUTION FOR 3D NAND STRUCTURE SHEET

(71) Applicant: HUBEI SINOPHORUS ELECTRONIC MATERIALS CO., LTD., Yichang (CN)

(72) Inventors: Shaoping Li, Yichang (CN); Zhaobo He, Yichang (CN); Fan Feng, Yichang (CN); Rui Ye, Yichang (CN); Ting Zhang, Yichang (CN); Changsheng Ban, Yichang (CN); Kai Feng, Yichang (CN); Shuping Wang, Yichang (CN); Fei Peng, Yichang (CN)

(73) Assignee: HUBEI SINOPHORUS ELECTRONIC MATERIALS CO., LTD. (CN)

( * ) Notice: Subject to any disclaimer, the term of this patent is extended or adjusted under 35 U.S.C. 154(b) by 0 days.

(21) Appl. No.: 18/712,001

(22) PCT Filed: Mar. 23, 2023

(86) PCT No.: PCT/CN2023/083387

§ 371 (c)(1),
(2) Date: May 21, 2024

(87) PCT Pub. No.: WO2024/077875

PCT Pub. Date: Apr. 18, 2024

(65) Prior Publication Data

US 2025/0230357 A1 Jul. 17, 2025

(30) Foreign Application Priority Data

Oct. 10, 2022 (CN) ......................... 202211234631.0

(51) Int. Cl.

*C09K 13/06* (2006.01)
*H10B 41/20* (2023.01)
*H10B 43/20* (2023.01)
*H10P 50/28* (2026.01)

(52) U.S. Cl.

CPC ............. *C09K 13/06* (2013.01); *H10B 41/20* (2023.02); *H10B 43/20* (2023.02); *H10P 50/283* (2026.01)

(58) Field of Classification Search

None

See application file for complete search history.

(56) References Cited

U.S. PATENT DOCUMENTS

2022/0363990 A1* 11/2022 Wu ......................... C04B 35/10

* cited by examiner

*Primary Examiner* — Roberts P Culbert

(57) ABSTRACT

A selective etching solution for a 3D NAND structure sheet is provided. The etching solution includes phosphoric acid, a silane additive 1, a silane additive 2, and water. The etching solution provided by the present invention has etching selectivity on a silicon oxide film and a silicon nitride film, can selectively remove the silicon nitride film and prolong the life of the etching solution, and can adapt to etching of a laminated structure.

11 Claims, 5 Drawing Sheets

SELECTIVE ETCHING SOLUTION FOR 3D NAND STRUCTURE SHEET

TECHNICAL FIELD

The present invention belongs to the field of electronic chemicals, and in particular, relates to a selective etching solution for silicon oxide and silicon nitride.

BACKGROUND

3D NAND is an important process technology in a flash memory chip. More storage units are built in smaller space by a vertical lamination technology, so that more data storage units are obtained, which is three times that of a similar NAND technology and is also the mainstream trend of current development.

However, in the process of etching a 3D NAND structure with 192 layers by the etching solution, since the 3D NAND structure is a structure in which silicon oxide and silicon nitride are alternately laminated, the silicon oxide will be etched to a certain degree while the silicon nitride is etched. Therefore, the etching solution is required to have high selectivity on the silicon oxide, and the silicon oxide is slightly etched while the silicon nitride is etched. During etching, with the increase of the content of silicic acid in the solution, when a certain silicon content is reached, back adhesion is formed on the silicon oxide layer, and the granularity of the surface of a silicon wafer is improved, resulting in the unqualified electric performance of finished products and the reduction of the yield of chips.

To solve the above problem, it is necessary to add a composite additive in phosphoric acid, the etching of the silicon oxide can be inhibited and stabilized and the back adhesion of the surface of the silicon oxide can be reduced with the increase of the silicon content, and the etching rate of the silicon nitride can be maintained.

SUMMARY

The technical problem to be solved by the present invention is to provide a selective etching solution for silicon oxide and silicon nitride. The etching of the silicon oxide can be inhibited and stabilized and the back adhesion of the surface of the silicon oxide can be reduced with the increase of the silicon content. Meanwhile, the etching rate of the silicon nitride can be maintained. Furthermore, the etching of a NAND structure is adapted.

According to one aspect, the present invention relates to a selective etching solution for silicon oxide and silicon nitride. The etching solution includes 1.5-2.0% by mass of a silane additive 1, 2.0-2.5% by mass of a silane additive 2, 83-86% by mass of a phosphoric acid and the balance of water.

In the selective etching solution to which the present invention relates, the silane additive 1 is one of 3-glycidyloxypropyltrimethoxysilane, diethoxy(3-glycidyloxypropyl) methylsilane and triethoxy(3-epoxy propyl oxypropyl) silane.

The main function of the silane coupling agent 1 is to regulate and control the selection ratio of the silicon nitride to the silicon oxide. The action mechanism is hydrolysis of the silane coupling agent in the phosphoric acid. A chemical bond of a silicon-oxo-silicon structure can be attached to the surface of the silicon oxide, and a larger end group can bring a great steric-hinerance effect to hinder the etching of the phosphoric acid and the water on the surface of the silicon oxide, so that the synergy of the two effects inhibits the etching of the silicon oxide.

In the selective etching solution which the present invention relates to, the silane additive 2 is one of 2-cyanoethyltriethoxysilane, isocyanatopropyltriethoxysilane and ureapropyl triethoxysilane.

The main function of the silane coupling agent 2 is to prevent the back adhesion of the silicic acid to the silicon oxide. The hydrolysis of a carbon-nitrogen bond forms a chemical bond with high water solubility, such as hydroxyl and carboxyl, so the silane coupling agent 2 can be bonded to the silicic acid to prevent the back adhesion to the surface of the silicon oxide. The silane coupling agent 1 can be effectively attached to the surface of the silicon oxide, the silicic acid is attached to the surface of the silicon oxide more easily after being bonded with the silane coupling agent 1, so that the silane coupling agent 2 can act with the silane coupling agent 1, thereby reducing the ability attached to the surface of the silicon oxide. When the silicon content of the solution is high, the etching of the silicon oxide can achieve a positive etching effect.

In the etching solution of the present invention, the contents of the phosphoric acid and the water greatly affect the initial etching rates of the silicon oxide and the silicon nitride. That is, the higher the phosphoric acid content, the lower the water content and the higher the etching rate of the silicon oxide; and the lower the phosphoric acid content, the higher the water content, and the higher the etching rate of the silicon nitride. However, excessively high phosphoric acid concentration will easily lead to the dehydration and carbonization of the silane coupling agent, thereby resulting in failure. Furthermore, the etching rate of the silicon oxide will be increased rapidly, and excessively low phosphoric acid concentration cannot meet the requirement of stable water content in high-temperature etching.

The mass content ratio of the phosphoric acid to the water in the etching solution provided by the present invention is 6-8, preferably 7-7.5.

The 3D NAND structure sheet is a laminated structure of a silicon oxide film and a silicon nitride film, the thickness of the silicon nitride film is 500-1000 Å, the thickness of the silicon oxide film is 50-500 Å, and the number of layers of the laminated structure is 150-250.

According to another aspect, the present invention provides a method for preparing a selective etching solution for a 3D NAND structure sheet. Silane coupling agents A and B are mixed uniformly at room temperature and are added into a phosphoric acid solution to obtain the etching solution.

A phosphoric acid solution is preheated to 80-100° C.; and silane coupling agents A and B are mixed uniformly and are added into the phosphoric acid solution at 80-100° C., and the mixture is heated to 110-120° C. again, is subjected to heat preservation for 0.5-1 h and is cooled to room temperature to obtain the etching solution.

During preparation, if preparation is performed at normal temperature, the block phenomenon of gel is easily realized; and if the silane coupling agents A and B are mixed uniformly according to the ratio and are added into an aqueous solution of the phosphoric acid at normal temperature, and the mixed solution is slowly heated to 80-100° C., further preferably, 80° C., 90° C. and 100° C., the formed gel block may not completely disappear and may be mixed in the formed mixed solution. After the solution is further heated to 110-120° C., it can be ensured that the formed etching solution is completely dissolved and is further heated to 110° C. or 120° C.

The mass content of the silane coupling agent A is 1.5-2.0%;

the mass content of the silane coupling agent B is 2.0-2.5%;

the mass content of the phosphoric acid is 83-86%; the balance is water; the mass content ratio of the phosphoric acid to the water in the etching solution is 6-8, preferably 7-7.5;

the silane additive 1 is one of 3-glycidyloxypropyltrimethoxysilane, diethoxy(3-glycidyloxypropyl)methylsilane and triethoxy(3-epoxy propyl oxypropyl) silane; and the silane additive 2 is one of 2-cyanoethyltriethoxysilane, isocyanatopropyltriethoxysilane and ureapropyl triethoxysilane.

The 3D NAND structure sheet is a laminated structure of a silicon oxide film and a silicon nitride film, the thickness of the silicon nitride film is 500-1000 Å, the thickness of the silicon oxide film is 50-500 Å, and the number of layers of the laminated structure is 150-250.

According to another aspect, the present invention provides a method for etching a 3D NAND structure sheet by using a selective etching solution for the 3D NAND structure. A laminated structure of a silicon oxide film and a silicon nitride film is etched in the selective etchings solution at a working temperature of 156-164° C., further preferably, 160-0.5° C. In the etching solution provided by the present invention, the etching rates of the silicon nitride and the silicon oxide are increased when the temperature is raised, but the increasing ratio of the etching rate of the silicon oxide is higher than that of the silicon nitride, and the etching selection ratio is reduced. The selection ratio is increased when the temperature is reduced, but back adhesion of the silicon oxide will occur easily.

The selective etching solution includes the following raw materials:

the mass content of the silane coupling agent A is 1.5-2.0%;

the mass content of the silane coupling agent B is 2.0-2.5%;

the mass content of the phosphoric acid is 83-86%; and the balance is water. The mass content ratio of the phosphoric acid to the water in the etching solution is 6-8, preferably 7-7.5.

The silane additive 1 is one of 3-glycidyloxypropyltrimethoxysilane, diethoxy(3-glycidyloxypropyl)methylsilane and triethoxy(3-epoxy propyl oxypropyl) silane.

The silane additive 2 is one of 2-cyanoethyltriethoxysilane, isocyanatopropyltriethoxysilane and ureapropyl triethoxysilane.

The 3D NAND structure sheet is a laminated structure of a silicon oxide film and a silicon nitride film, the thickness of the silicon nitride film is 500-1000 Å, the thickness of the silicon oxide film is 50-500 Å, and the number of layers of the laminated structure is 150-250.

The silicon content in the etching process is 0-500 ppm.

When the content of the additional silicon of the etching solution is 0 ppm, the etching rate of the silicon nitride is greater than 2000 Å/30 min, the etching rate of the silicon oxide is less than 0.8 Å/30 min, and the selection ratio of the etching rate of the silicon nitride/the silicon oxide is greater than 2500; and when the content of the additional silicon of the etching solution is 300 ppm, the etching rate of the silicon nitride is greater than 1800 Å/30 min, and the etching rate of the silicon oxide is greater than 0.3 Å/30 min To verify the etching effect of the selective etching solution, the present invention performs an etching experiment after slicing the silicon oxide and the silicon nitride.

To verify the etching effect of the selective etching solution on the laminated structure, the present invention performs an etching experiment by selecting a sliced 3D NAND structure sheet.

Reagents and raw materials used in the present invention can be purchased in the market.

On the basis of meeting the common sense in the art, an example with a better etching effect of the present invention can be obtained through the combination of the preferred conditions.

The present invention has the following advantages: compared with the prior art, the present invention provides an etching solution with selectivity on silicon nitride and silicon oxide. The etching solution has longer etching life while inhibiting the etching of the silicon oxide.

(1) According to the etching solution provided by the present invention, the initial etching rate on the silicon nitride is greater than 2000 Å/30 min, and the etching selection ratio is greater than 2500.

(2) According to the etching solution provided by the present invention, the etching life of the solution and the silicon content window are broadened by a hydrolysis group with high water solubility, the positive etching effect of the silicon oxide is achieved mainly by preventing the back adhesion of the silicic acid, and in a case that the silicon content is 300 ppm, the etching rate of the silicon nitride is greater than 1800 Å/30 min and the etching rate of the silicon oxide is greater than 0.3 Å/30 min.

(3) The etching solution provided by the present invention can be used for etching the 3D NAND structure sheet with 192 layers, the toothed structure is clear and complete, adhesion among layers is avoided, and no back adhesion of the silicon oxide layer will occur in a case that the silicon content is 300 ppm.

DETAILED DESCRIPTION OF EMBODIMENTS

Figure 1:
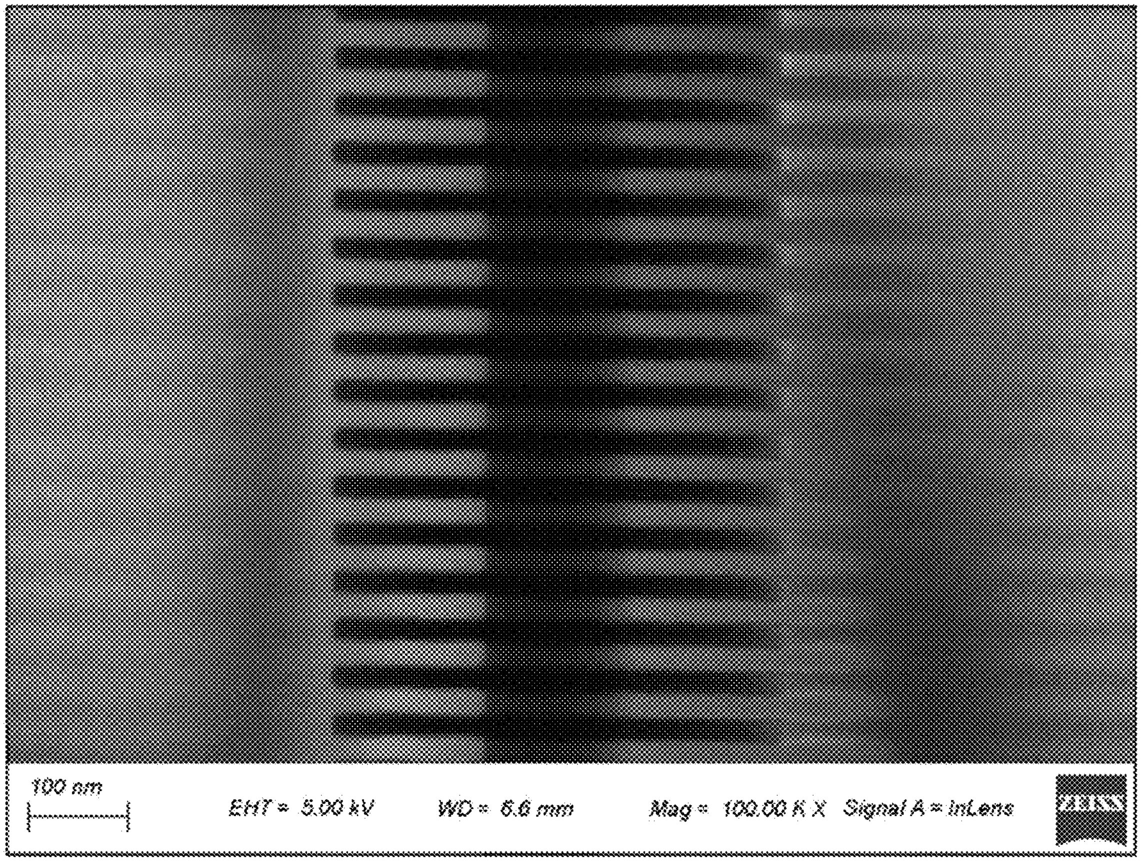
FIG. 1 is an SEM image after a 3D NAND structure sheet is etched in a case that the silicon content is 0 ppm in Embodiment 3.
Figure 2:
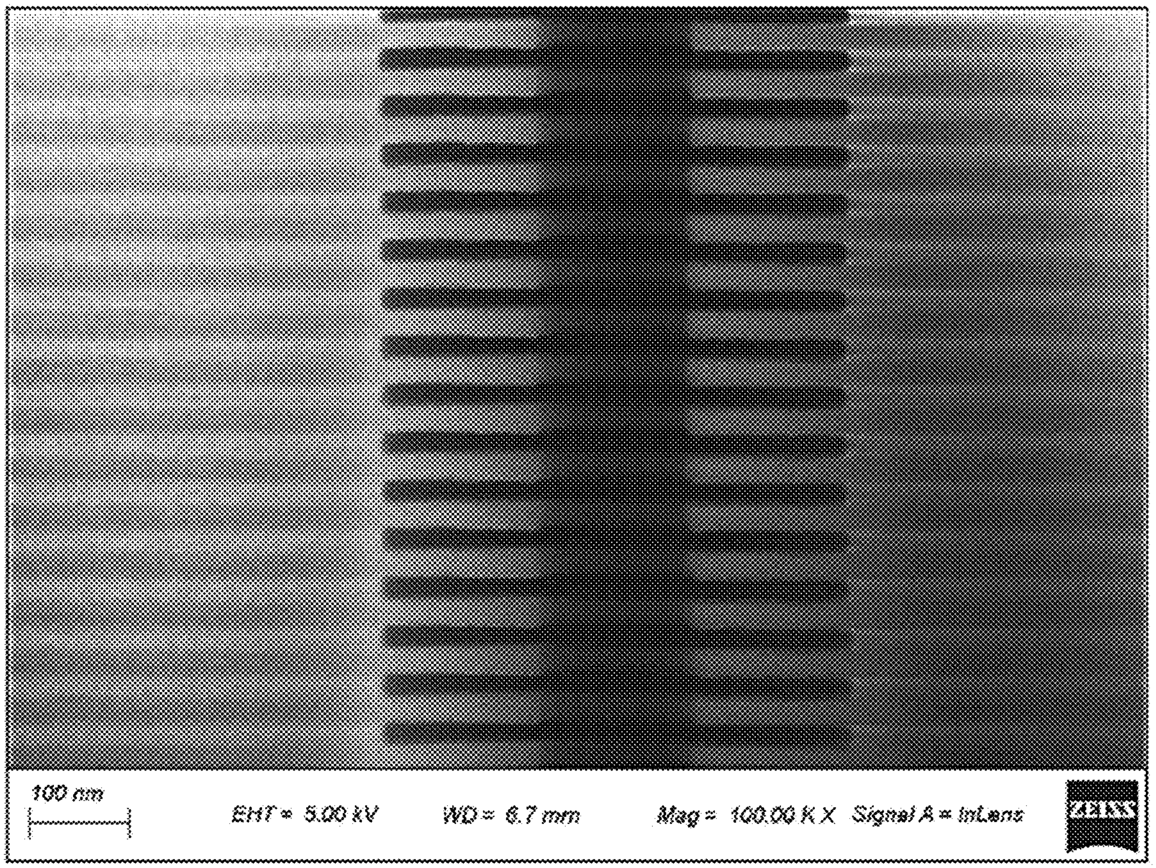
FIG. 2 is an SEM image after a 3D NAND structure sheet is etched in a case that the silicon content is 100 ppm in Embodiment 3.
Figure 3:
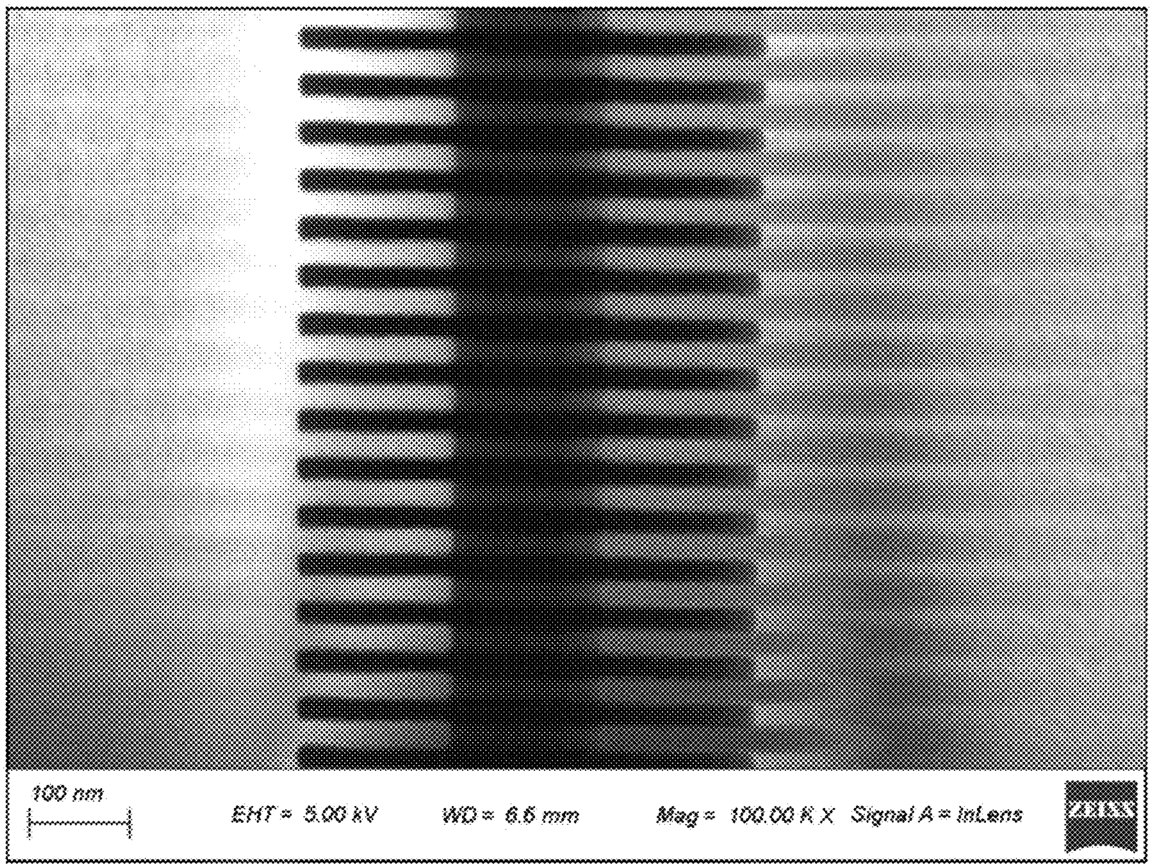
FIG. 3 is an SEM image after a 3D NAND structure sheet is etched in a case that the silicon content is 200 ppm in Embodiment 3.
Figure 4:
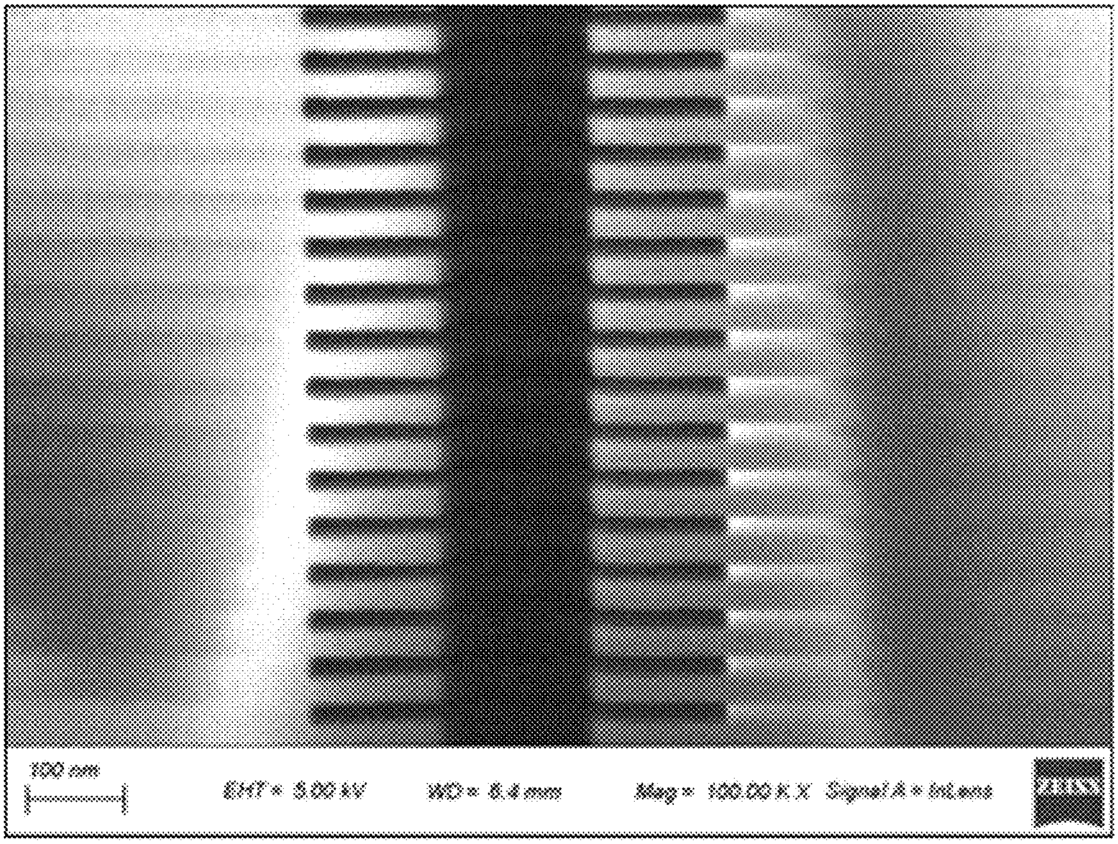
FIG. 4 is an SEM image after a 3D NAND structure sheet is etched in a case that the silicon content is 300 ppm in Embodiment 3.
Figure 5:
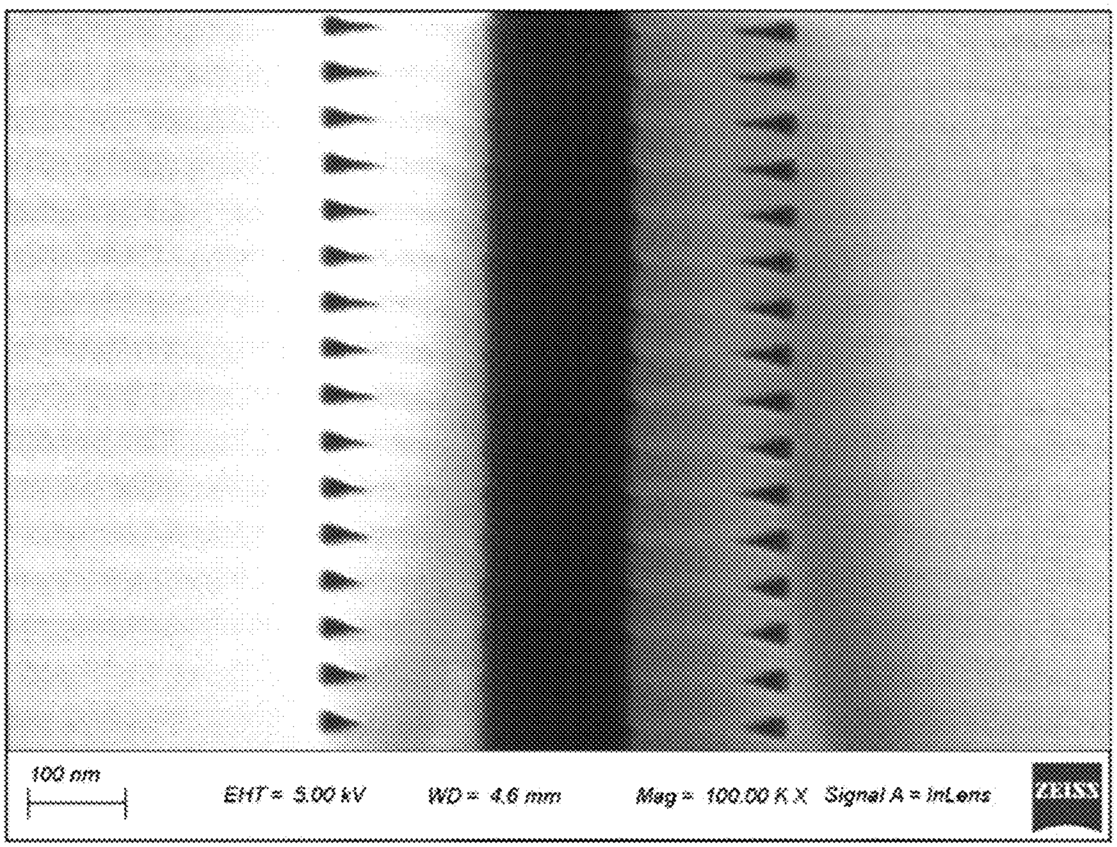
FIG. 5 is an SEM image after a 3D NAND structure sheet is etched in a case that the silicon content is 300 ppm in Comparative Example 1.

The following clearly and completely describes the technical solutions in the embodiments of the present invention with reference to the specific embodiments of the present invention. The described embodiments are merely a part rather than all of the embodiments of the present invention. All other embodiments obtained by a person of ordinary skill in the art based on the embodiments of the present invention without creative efforts shall fall within the protection scope of the present invention.

1. Preparation of Etching Solution

Silane coupling agents 1 and 2 were mixed uniformly at room temperature according to the ratio and were added into an aqueous solution of phosphoric acid with the concentration of 86.5% at 80° C., and after the silane coupling agents were completely dissolved in the phosphoric acid, the mixed solution was heated to 120° C. for 1 h and finally was cooled to room temperature.

2. Etching Experiment 2.1 Method for Detecting Etching Rate

Wafers were etched: a silicon oxide film and a silicon nitride film; the deposition thicknesses of the two film materials on a silicon semiconductor chip are respectively 300 Å and 1000 Å; and the two film materials were sliced into long strips of 1.5 cm*3 cm during test.

Etching temperature: 160=0.5° C.

Etching time: the silicon oxide film was etched for 3600 s, and the silicon nitride film was etched for 300 s.

A method for calculating the etching rate: the thicknesses of the silicon oxide film and the silicon nitride film before and after etching were detected by a spectroscopie ellipsometer, and the etching rate was obtained by dividing the etching time by the difference between the initial thickness and the thickness after etching. The etching selection ratio is the ratio of the etching rate of silicon nitride (SiN E/R) to the etching rate of silicon oxide (SiO E/R).

2.2 Method for Detecting Etching Life

With the etching of the silicon nitride layer, the silicon content in the etching solution is increased gradually, and the etching of the silicon oxide and the etching of the silicon nitride are inhibited. In a case that the initial silicon content of the etching solution was 0 ppm, the silicon nitride was dissolved in the etching solution to prepare the etching solution with the silicon content of 100 ppm, 200 ppm and 300 ppm, and the etching rates and the selection ratio of the silicon oxide and the silicon nitride were tested respectively to present the life of the etching solution.

2.3 Etching Test of Laminated Structure

Etching experiment: a 3D NAND structure sheet were etched respectively by the etching solution with the silicon content of 0 ppm, 100 ppm, 200 ppm and 300 ppm, where the etching condition is the same as that of the rate detection, and the etching time is 20 min.

Detection method: a high-resolution SEM picture of the section of the 3D NAND structure sheet was taken to analyze the etching effect and the back adhesion.

Embodiments 1-11 and Comparative Example 1-7 are shown in Table 1, where the contents of the phosphoric acid and the silane coupling agents are represented by mass percentage, and the balance is water.

TABLE 1

Content of each component in embodiments and comparative examples

| | Phosphoric Acid (wt %) | Silane Coupling Agent 1 | (wt %) | Silane Coupling Agent 2 | (wt %) |
|---|---|---|---|---|---|
| Embodiment 1 | 84.67 | 3-glycidyloxypropyl-trimethoxysilane | 1.6 | 2-cyanoethyl-triethoxysilane | 2.1 |
| Embodiment 2 | 84.87 | 3-glycidyloxypropyl-trimethoxysilane | 1.6 | Isocyanatopropyl-triethoxysilane | 2.3 |
| Embodiment 3 | 85.03 | 3-glycidyloxypropyl-trimethoxysilane | 1.6 | Ureapropyl triethoxysilane | 2.5 |
| Embodiment 4 | 85.12 | Diethoxy(3-glycidyloxypropyl) methylsilane | 1.8 | 2-cyanoethyl-triethoxysilane | 2.1 |
| Embodiment 5 | 85.16 | Diethoxy(3-glycidyloxypropyl) methylsilane | 1.8 | Isocyanatopropyl-triethoxysilane | 2.3 |
| Embodiment 6 | 84.98 | Diethoxy(3-glycidyloxypropyl) methylsilane | 1.8 | Ureapropyl triethoxysilane | 2.5 |
| Embodiment 7 | 84.87 | Triethoxy(3-epoxy propyl oxypropyl)silane | 2.0 | 2-cyanoethyl-triethoxysilane | 2.1 |
| Embodiment 8 | 85.14 | Triethoxy(3-epoxy propyl oxypropyl)silane | 2.0 | Isocyanatopropyl-triethoxysilane | 2.3 |
| Embodiment 9 | 84.98 | Triethoxy(3-epoxy propyl oxypropyl)silane | 2.0 | Ureapropyl triethoxysilane | 2.5 |
| Embodiment 10 | 87.23 | 3-glycidyloxypropyl-trimethoxysilane | 1.6 | 2-cyanoethyl-triethoxysilane | 2.1 |
| Embodiment 11 | 83.62 | 3-glycidyloxypropyl-trimethoxysilane | 1.6 | 2-cyanoethyl-triethoxysilane | 2.1 |
| Comparative Example 1 | 85.23 | 3-glycidyloxypropyl-trimethoxysilane | 1.6 | None | — |

TABLE 1-continued

| Content of each component in embodiments and comparative examples | | | | | |
|---|---|---|---|---|---|
| | Phosphoric Acid (wt %) | Silane Coupling Agent 1 | (wt %) | Silane Coupling Agent 2 | (wt %) |
| Comparative Example 2 | 84.67 | Diethoxy(3-glycidyloxypropyl) methylsilane | 1.8 | None | — |
| Comparative Example 3 | 85.23 | Triethoxy(3-epoxy propyl oxypropyl)silane | 2.0 | None | — |
| Comparative Example 4 | 85.11 | None | — | 2-cyanoethyl-triethoxysilane | 2.1 |
| Comparative Example 5 | 84.98 | None | — | Isocyanatopropyl-triethoxysilane | 2.3 |
| Comparative Example 6 | 85.08 | None | — | Ureapropyl triethoxysilane | 2.5 |
| Comparative Example 7 | 85.50 | None | — | None | — |

In a case that the initial silicon content is 0 ppm, the etching rates of the etching solution in Embodiments 1-11 and Comparative Example 1-7 on the silicon oxide film and the silicon nitride film, and the selection ratio are shown in Table 2.

TABLE 2

| Etching rate and selection ratio in a case that the silicon content is 0 ppm | | | |
|---|---|---|---|
| Etching Solution | SiO E/R (Å/30 min) | SiN E/R (Å/30 min) | Selection Ratio |
| Embodiment 1 | 0.77 | 2087.6 | 2711.2 |
| Embodiment 2. | 0.71 | 2068.5 | 2913.4 |
| Embodiment 3 | 0.65 | 2021.6 | 3110.2 |
| Embodiment 4 | 0.76 | 2089.4 | 2749.2 |
| Embodiment 5 | 0.70 | 2045.9 | 2922.7 |
| Embodiment 6 | 0.68 | 2019.5 | 2969.9 |
| Embodiment 7 | 0.74 | 2066.3 | 2792.3 |
| Embodiment 8 | 0.68 | 2023.8 | 2976.2 |
| Embodiment 9 | 0.64 | 2011.0 | 3142.2 |
| Embodiment 10 | 1.56 | 1905.6 | 1221.6 |
| Embodiment 11 | 0.89 | 2104.5 | 2364.6 |
| Comparative Example 1 | 1.02 | 1865.9 | 1829.3 |
| Comparative Example 2 | 0.89 | 1854.7 | 2083.9 |
| Comparative Example 3 | 0.73 | 1834.4 | 2512.9 |
| Comparative Example 4 | 45.56 | 2068.1 | 45.4 |
| Comparative Example 5 | 28.34 | 2054.7 | 72.5 |
| Comparative Example 6 | 20.33 | 2032.9 | 100.0 |
| Comparative Example 7 | 78.34 | 2245.1 | 28.7 |

In the experiment of Embodiment 11, since the boiling point is low, the boiling situation is unstable, the heating time is long and one part of water is evaporated, the experiment conditions cannot be stable, the initial selection ratio of Embodiment 10 cannot meet the corresponding requirement, more preferably, the ratio in Embodiment 1, and the whole experiment is performed mainly around the ratio in Embodiment 1.

In a case that the silicon content is 100 ppm, the etching rates of the etching solution in Embodiments 1-9 and Comparative Example 1-7 on the silicon oxide film and the silicon nitride film, and the selection ratio are shown in Table 3.

TABLE 3

| Etching rate and selection ratio in a case that the silicon content is 100 ppm | | | |
|---|---|---|---|
| Eteching Solution | SiO E/R (Å/30 min) | SiN E/R (Å/30 min) | Selection Ratio |
| Embodiment 1 | 0.75 | 1975.2 | 2633.6 |
| Embodiment 2 | 0.67 | 1963.6 | 2930.7 |
| Embodiment 3 | 0.59 | 1953.7 | 3311.3 |
| Embodiment 4 | 0.71 | 1975.4 | 2782.2 |
| Embodiment 5 | 0.65 | 1965.1 | 3023.2 |
| Embodiment 6 | 0.60 | 1958.9 | 3264.8 |
| Embodiment 7 | 0.69 | 1965.4 | 2848.4 |
| Embodiment 8 | 0.62 | 1957.3 | 3156.9 |
| Embodiment 9 | 0.57 | 1945.9 | 3413.8 |
| Comparative Example 1 | 0.43 | 1789.5 | 4161.6 |
| Comparative Example 2 | 0.32 | 1797.3 | 5616.5 |
| Comparative Example 3 | 0.33 | 1767.6 | 5356.3 |
| Comparative Example 4 | 30.34 | 1976.5 | 65.1 |
| Comparative Example 5 | 17.51 | 1987.5 | 113.5 |
| Comparative Example 6 | 12.93 | 1988.4 | 153.7 |
| Comparative Example 7 | 5.80 | 2072.6 | 357.3 |

In a case that the silicon content is 200 ppm, the etching rates of the etching solution in Embodiments 1-9 and Comparative Example 1-7 on the silicon oxide film and the silicon nitride film, and the selection ratio are shown in Table 4.

TABLE 4

| Etching rate and selection ratio in a case that the silicon content is 200 ppm | | | |
|---|---|---|---|
| Etching Solution | SiO E/R (Å/30 min) | SiN E/R (Å/30 min) | Selection Ratio |
| Embodiment 1 | 0.69 | 1865.3 | 2703.3 |
| Embodiment 2 | 0.60 | 1856.7 | 3094.5 |
| Embodiment 3 | 0.52 | 1853.8 | 3565.0 |
| Embodiment 4 | 0.63 | 1868.2 | 2965.4 |
| Embodiment 5 | 0.57 | 1854.9 | 3254.2 |
| Embodiment 6 | 0.51 | 1851.8 | 3631.0 |
| Embodiment 7 | 0.61 | 1868.4 | 3063.0 |
| Embodiment 8 | 0.54 | 1855.9 | 3436.9 |

TABLE 4-continued

Etching rate and selection ratio in a case that the silicon content is 200 ppm

| Etching Solution | SiO E/R (Å/30 min) | SiN E/R (Å/30 min) | Selection Ratio |
|---|---|---|---|
| Embodiment 9 | 0.49 | 1845.7 | 3766.7 |
| Comparative Example 1 | 0.22 | 1743.9 | 7926.8 |
| Comparative Example 2 | 0.19 | 1732.8 | 9120.0 |
| Comparative Example 3 | 0.20 | 1723.0 | 8615.0 |
| Comparative Example 4 | 15.38 | 1903.2 | 123.7 |
| Comparative Example 5 | 11.56 | 1883.8 | 163.0 |
| Comparative Example 6 | 8.72 | 1845.7 | 211.7 |
| Comparative Example 7 | −5.76 | 1873.0 | — |

Note: a negative number indicates the thickening rate of the silicon oxide film at a high silicon content.

In a case that the silicon content is 300 ppm, the etching rates of the etching solution in Embodiments 1-9 and Comparative Example 1-7 on the silicon oxide film and the silicon nitride film, and the selection ratio are shown in Table 4.

TABLE 5

Etching rate and selection ratio in a case that the content is 300 ppm

| Etching Solution | SiO E/R (Å/30 min) | SiN E/R (Å/30 min) | Selection Ratio |
|---|---|---|---|
| Embodiment 1 | 0.56 | 1784.3 | 3186.3 |
| Embodiment 2 | 0.52 | 1767.8 | 3399.6 |
| Embodiment 3 | 0.46 | 1762.8 | 3832.2 |
| Embodiment 4 | 0.54 | 1784.7 | 3305.0 |
| Embodiment 5 | 0.49 | 1775.8 | 3624.1 |
| Embodiment 6 | 0.43 | 1765.9 | 4106.7 |
| Embodiment 7 | 0.51 | 1773.2 | 3476.9 |
| Embodiment 8 | 0.47 | 1769.3 | 3764.5 |
| Embodiment 9 | 0.41 | 1762 | 4297.6 |
| Comparative Example 1 | −0.33 | 1686.2 | −5109.7 |
| Comparative Example 2 | −0.41 | 1657.8 | −4043.4 |
| Comparative Example 3 | −0.49 | 1678.6 | −3425.7 |
| Comparative Example 4 | 7.46 | 1856.6 | 248.9 |
| Comparative Example 5 | 3.59 | 1827.6 | 509.1 |
| Comparative Example 6 | 2.35 | 1804.8 | 768.0 |
| Comparative Example 7 | −15.42 | 1727.8 | — |

It can be seen from the above experimental data that the silane coupling agent 1 in Comparative Example 1-3 have a high initial selection ratio, but with the continuous increase of the silicon content, the etching rate of the silicon oxide is reduced rapidly; furthermore, when the silicon content reaches 300 ppm, a back adhesion phenomenon occurs; the silane coupling agent 2 in Comparative Example 4-6 does not have a good initial selection ratio, but positive etching is maintained while the silicon content is increased continuously; and in Embodiments 1-9, the advantages of the two kinds of silane are combined, in a case that the silicon content is 0-300 ppm, the etching rate of the silicon oxide is maintained between 0.3 Å/30 min and 0.8 Å/30 min, the etching rate of the silicon nitride is maintained between 1800 Å/30 min and 2100 Å/30 min, and no back adhesion phenomenon occurs. In Embodiments 10 and 11, to adjust the mass fraction ratio of the phosphoric acid to the water, in a case that the mass content ratio of the phosphoric acid to the water is less than 7, the phenomenon that the boiling situation of the solution in the etching process is unstable occurs in Embodiment 11, which is unfavorable for actual preparation; and in a case that the mass content ratio of the phosphoric acid to the water is greater than 8, for example, in Embodiment 10, the etching rate of the silicon oxide is excessively high and the selection ratio cannot meet the requirement of this patient, the etching result can be stabilized when the ratio is preferably 7-7.5.

It can be seen from the SEM image of the structure sheet, in Embodiment 3, in a case that the silicon content is 300 ppm, the etched 3D NAND structure sheet with 192 layers still shows a clear toothed structure without adhesion, the silicon oxide layer has no adhesion phenomenon, and the etching result of the pure phosphoric acid is significantly improved. In addition, other embodiments can achieve the similar etching effect on the structure sheet in a case of 0-300 ppm. The drawings in Embodiments 1, 2 and 3-9 are similar to the drawing in Embodiment 3. The drawings in Comparative Example 1-3 at 300 ppm are similar to the drawing in Comparative Example 1.

The above describes the selective etching solution for silicon oxide and silicon nitride provided by the present invention in detail. The above are only the specific embodiments of the present invention and are not used to limit the protection scope of the present invention. It is apparent for those skilled in the art that some modifications or improvements may be made on the basis of the present invention. Therefore, these modifications or improvements made without departing from the spirit of the present invention all fall within the protection scope of the present invention.

What is claimed is:

1. A selective etching solution for a 3D NAND structure sheet, the selective etching solution comprising the following raw materials in parts by mass:

1.5-2.0% of a silane coupling agent 1, 2.0-2.5% of a silane coupling agent 2, 83-86% of a phosphoric acid and a balance of water;

wherein the silane coupling agent 1 is 3-glycidyloxypropyltrimethoxysilane, diethoxy(3-glycidyloxypropyl)methylsilane or triethoxy(3-epoxy propyl oxypropyl)silane;

and the silane coupling agent 2 is 2-cyanoethyltriethoxysilane, isocyanatopropyltriethoxysilane or ureapropyl triethoxysilane.

2. The selective etching solution for a 3D NAND structure sheet according to claim 1, wherein a mass content ratio of the phosphoric acid to the water in the etching solution is 6-8.

3. The selective etching solution for a 3D NAND structure sheet according to claim 1, wherein the 3D NAND structure sheet is a laminated structure of a silicon oxide film and a silicon nitride film, a thickness of the silicon nitride film is 500-1000 Å, a thickness of the silicon oxide film is 50-500 Å, and a number of layers of the laminated structure is 150-250.

4. A method for preparing a selective etching solution for a 3D NAND structure sheet according to claim 1, wherein silane coupling agent 1 and silane coupling agent 2 are mixed uniformly at room temperature and are added into a phosphoric acid solution to obtain the etching solution.

5. The method according to claim 4, wherein the phosphoric acid solution is preheated to 80-100° C.; and the silane coupling agent 1 and silane coupling agent 2 are mixed uniformly and are added into the phosphoric acid solution at 80-100° C., and a mixture is heated to 110-120° C. again, is subjected to heat preservation for 0.5-1 h and is cooled to room temperature to obtain the etching solution.

6. The method according to claim 5, wherein a mass content of the silane coupling agent 1 is 1.5-2.0%;

a mass content of the silane coupling agent 2 is 2.0-2.5%;

a mass content of the phosphoric acid is 83-86%, a balance is water, a mass content ratio of the phosphoric acid to the water in the etching solution is 6-8, preferably 7-7.5;

the silane coupling agent 1 is 3-glycidyloxypropyltrimethoxysilane, diethoxy(3-glycidyloxypropyl)methylsilane or triethoxy(3-epoxy propyl oxypropyl)silane; and the silane coupling agent 2 is 2-cyanoethyltriethoxysilane, isocyanatopropyltriethoxysilane or ureapropyl triethoxysilane.

7. The method according to claim 6, wherein the 3D NAND structure sheet is a laminated structure of a silicon oxide film and a silicon nitride film, a thickness of the silicon nitride film is 500-1000 Å, a thickness of the silicon oxide film is 50-500 Å, and a number of layers of the laminated structure is 150-250.

8. A method for etching a 3D NAND structure sheet by using a selective etching solution for the 3D NAND structure according to claim 1, wherein a laminated structure of a silicon oxide film and a silicon nitride film is etched in the selective etchings solution at a working temperature of 156-164° C.

9. The method according to claim 8, wherein the selective etching solution comprises the following raw materials:

a mass content of silane coupling agent 1 is 1.5-2.0%;

a mass content of silane coupling agent 2 is 2.0-2.5%;

a mass content of the phosphoric acid is 83-86%: a balance is water; a mass content ratio of the phosphoric acid to the water in the etching solution is 6-8, preferably 7-7.5;

the silane coupling agent 1 is 3-glycidyloxypropyltrimethoxysilane, diethoxy(3-glycidyloxypropyl)methylsilane or triethoxy(3-epoxy propyl oxypropyl)silane;

the silane coupling agent 2 is 2-cyanoethyltriethoxysilane, isocyanatopropyltriethoxysilane or ureapropyl triethoxysilane; and the 3D NAND structure sheet is a laminated structure of a silicon oxide film and a silicon nitride film, a thickness of the silicon nitride film is 500-1000 Å, a thickness of the silicon oxide film is 50-500 Å, and a number of layers of the laminated structure is 150-250.

10. The method according to claim 9, wherein the 3D NAND structure sheet is a laminated structure of a silicon oxide film and a silicon nitride film, the thickness of the silicon nitride film is 500-1000 Å, the thickness of the silicon oxide film is 50-500 Å, and the number of layers of the laminated structure is 150-250.

11. The method according to claim 10, wherein a silicon content in the etching process is 0-500 ppm;

when a content of the additional silicon of the etching solution is 0 ppm, an etching rate of the silicon nitride is greater than 2000 Å/30 min, a etching rate of the silicon oxide is less than 0.8 Å/30 min, and a selection ratio of the etching rate of the silicon nitride/the silicon oxide is greater than 2500; and when the content of the additional silicon in the etching solution is 300 ppm, the etching rate of the silicon nitride is greater than 1800 Å/30 min, and the etching rate of the silicon oxide is greater than 0.3 Å/30 min.

* * * * *